United States Patent
Liu et al.

(10) Patent No.: US 6,908,813 B2
(45) Date of Patent: Jun. 21, 2005

(54) METHOD OF FORMING TINY SILICON NITRIDE SPACER FOR FLASH EPROM BY FULLY WET ETCHING TECHNOLOGY

(75) Inventors: Hung-Hsin Liu, Hsinchu (TW); Kuei-Jen Chang, Hsin-Chu (TW); Tsung-Chi Hsieh, Tamshui (TW); Yuan-Ko Hwang, Hualien (TW); Shih Chiung Chen, Hsin Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/410,121

(22) Filed: Apr. 9, 2003

(65) Prior Publication Data

US 2004/0203205 A1 Oct. 14, 2004

(51) Int. Cl.$^7$ ............................................. H01L 21/336
(52) U.S. Cl. .................... 438/257; 438/745; 438/689
(58) Field of Search ......................................... 438/257

(56) References Cited

U.S. PATENT DOCUMENTS

| | | | |
|---|---|---|---|
| 5,879,993 A | | 3/1999 | Chien et al. ................. 438/266 |
| 5,915,178 A | * | 6/1999 | Chiang et al. ............... 438/266 |
| 6,001,690 A | * | 12/1999 | Chien et al. ................. 438/266 |
| 6,046,086 A | | 4/2000 | Lin et al. ..................... 438/264 |
| 6,069,042 A | | 5/2000 | Chien et al. ................. 438/266 |
| 6,074,914 A | | 6/2000 | Ogura ......................... 438/257 |
| 6,093,608 A | * | 7/2000 | Lin et al. ..................... 438/266 |
| 6,140,192 A | * | 10/2000 | Huang et al. ............... 438/305 |
| 6,174,772 B1 | | 1/2001 | Hsieh et al. ................. 438/264 |
| 6,200,860 B1 | * | 3/2001 | Chiang et al. ............... 438/266 |
| 6,284,596 B1 | * | 9/2001 | Sung et al. .................. 438/257 |
| 6,380,030 B1 | * | 4/2002 | Chen et al. .................. 438/257 |
| 6,617,638 B2 | * | 9/2003 | Chiang et al. ............... 257/316 |
| 6,624,466 B2 | * | 9/2003 | Chen et al. .................. 257/315 |
| 6,706,601 B1 | * | 3/2004 | Liu et al. ..................... 438/266 |

\* cited by examiner

Primary Examiner—Thao P. Le

(57) ABSTRACT

A method of forming very small silicon nitride spacers in split-gate flash EPROMs is disclosed which prevent the occurrence of "write disturb", unwanted reverse tunneling, or erasing. This is accomplished by forming spacers with well-controlled dimensions and well-defined shapes through a judicious use of a fully wet etch technique, including main-etch and over-etch. The use of a phosphoric acid solution in combination with sulfuric acid+hydrogen peroxide widens the process window from a few seconds to several minutes so that the small-dimensioned silicon nitride spacers can be better controlled than it has been possible in the past. In the first embodiment phosphoric solution is used both for main-etch and for over-etch. In the second embodiment, phosphoric solution is used for main-etch only, while the sulfuric+hydrogen peroxide solution is used as an over-etch in forming the tiny silicon nitride spacers of the invention. In the third embodiment, the step of over-etching of the spacers is combined with the step of stripping off of an implant photomask, thus, shortening the manufacturing product cycle.

28 Claims, 6 Drawing Sheets

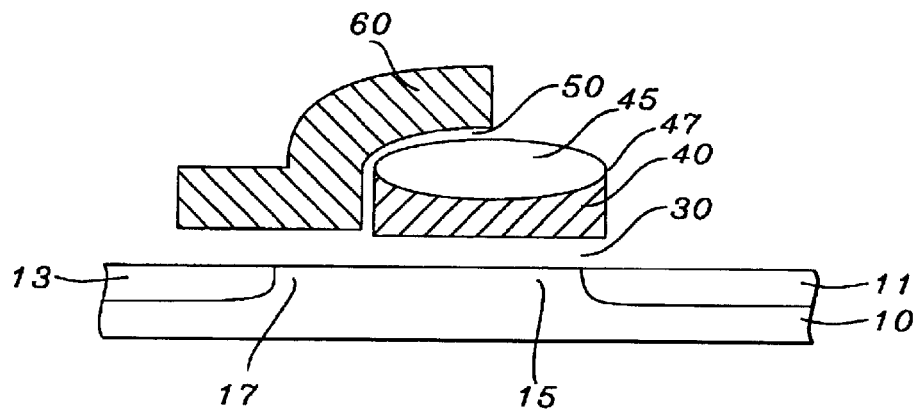
FIG. 1 – Prior Art
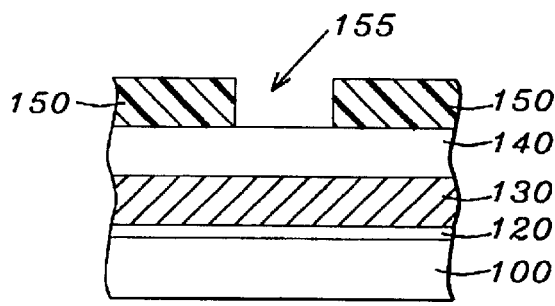
FIG. 2a
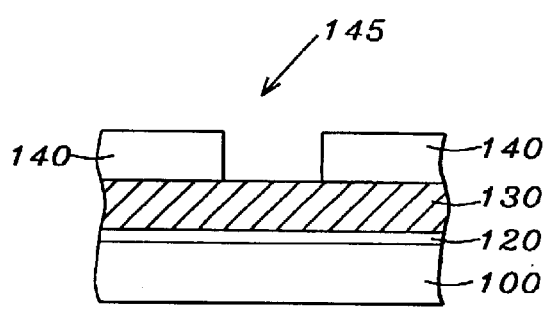
FIG. 2b
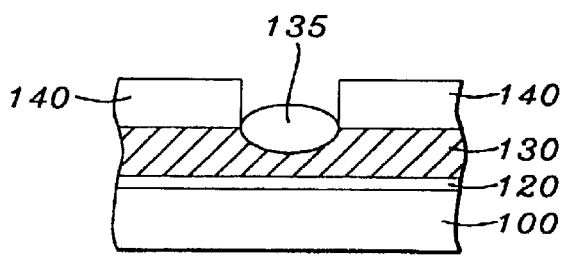
FIG. 2c
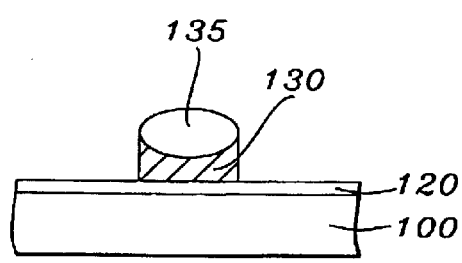
FIG. 2d

METHOD OF FORMING TINY SILICON NITRIDE SPACER FOR FLASH EPROM BY FULLY WET ETCHING TECHNOLOGY

BACKGROUND OF THE INVENTION (1) Field of the Invention

The present invention relates to split-gate memory cells used in flash EEPROMs (Electrically Erasable Programmable Read Only Memories), and in particular, to a method of forming a tiny silicon nitride spacer by using a fully wet etching technology in order to provide an improved process window.

(2) Description of the Related Art

Process windows in forming nitride spacers are usually very tight, as is well known in the art. For example, process window, that is, time to etch nitride spacers for split-gate flash memory cells are on the order of a few seconds. This is because, in general, anisotropic dry etch is used, which is very fast. Especially when very small spacers are required for better performance of split-gate cells, a few seconds of etch time makes it very difficult to control the dimensions, let alone the shape of the spacers. A poorly defined spacer will cause, what is known in the art as "write disturb", or, unwanted reverse tunneling, or erasing. Also, the endurance (the number of times the cell can be written and erased) is degraded as well as the erase and program (writing) speed of the cell. It is disclosed later in the embodiments of the present invention a method of opening up the etching process window from tens of seconds to several minutes with the attendant result of having much better controlled tiny silicon nitride spacers, and hence improved flash EPROM.

Most conventional flash-EEPROM cells use a double-polysilicon (poly) structure of which the well-known split-gate cell is shown in FIG. 1. There, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

The programming and erasing of an EEPROM is accomplished electrically and in-circuit by using Fowler-Nordheim (F-N) tunneling as is well known in prior art. Basically, a sufficiently high voltage is applied to the control gate and source while the drain is providing a constant flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the source to a sufficiently high value of about 12 volts so that the floating gate will couple to about 8 volts. As the electronic charge builds up on the floating gate, the electric field is reduced, which reduces the electron flow. When, finally, the high voltage is removed, the floating gate remains charged to a value lower than the threshold voltage of a logic high that would turn it off. Since tunneling process is reversible, the floating gate can be erased by raising the control gate voltage and grounding the drain and source voltage, thereby causing the stored charge on the floating gate to flow to the control gate by F-N tunneling. Of importance in the tunneling region is the quality and the thinness of the tunneling oxide separating the floating gate from the substrate. Inadvertent reverse tunneling, or erasure, for example, may occur if the tunnel oxide is degraded, or the spacer formed between the floating gate and the control gate is poorly shaped.

In prior art, spacers are formed in various, different ways. Hsieh, et al., in U.S. Pat. No. 6,174,772 describe forming nitride spacers in a split-gate flash memory cell. The nitride spacers are formed on a pad oxide prior to the forming of an intergate oxide layer. In this manner, any damage that would normally occur to the intergate oxide during the etching of the nitride spacers subsequent to the forming of the intergate oxide is avoided. Consequently, the variation in the thickness of the intergate oxide due to the unpredictable damage to the underlying spacers is also avoided by reversing the order in which the spacers and the intergate oxide are formed, including the forming of the pad oxide first.

In a different approach, Chien, et al., in U.S. Pat. No. 5,879,993 form a spacer structure adjacent to the sidewall of a floating gate electrode with a top surface and sidewalls, the floating gate electrode being formed on a silicon oxide dielectric layer, and the silicon oxide dielectric layer being formed on the top surface of a semiconductor substrate. The method includes the following steps: form a cap layer on the floating gate electrode, and a blanket tunnel oxide on the device; forming an inner dielectric, spacer layer over the device including the cap layer and the sidewalls thereby with conforming sidewalls, and an outer dielectric, spacer layer over the inner dielectric, spacer layer including the conforming sidewalls; etching partially the outer dielectric, spacer layer with a dry etch to form an outer dielectric spacer adjacent to the conforming sidewalls; partially etching more of the outer dielectric, spacer layer with a wet etch to expose a portion of the conforming sidewalls of the inner dielectric, spacer layer; etching the portion of the inner dielectric, spacer layer unprotected by the outer dielectric spacer before forming interelectrode dielectric layers and the control gate electrode.

Another method of forming spacers for flash EEPROM devices is disclosed by Chien, et al., in U.S. Pat. No. 6,001,690. A silicon nitride layer is formed over the floating gate in a memory cell. In one embodiment, a full isotropic/anisotropic etching of a particular recipe is performed on the nitride layer, while in a second embodiment a partial isotropic/anisotropic etching is followed by full anisotropic etching, using a different recipe.

In still another U.S. Pat. No. 6,069,042, Chien, et al., teach a method for forming a multi-layer spacer (MLS) for flash EPROM devices. A composite tetraethylorthosilicate-silicon nitride (TEOS/$Si_3N_4$) layer is deposited over the floating gate and anisotropically etched to form the MLS.

On the other hand, Lin, et al., provide a method for forming a split-gate flash memory cell in U.S. Pat. No. 6,046,086, where an extra thin nitride layer is formed over the primary gate oxide layer, while Ogura, in U.S. Pat. No. 6,074,914, teaches a method of fabricating an electrically programmable read only memory device, which consists of a control/word gate and a floating gate on the side wall of the control gate.

It is disclosed in the present invention a different method of forming a spacer in a split-gate flash memory cell where only isotropic wet etch is used.

SUMMARY OF THE INVENTION

It is therefore an object of this invention to provide method of forming very small silicon nitride spacers in split-gate flash EPROM cells in order to prevent the occurrence of "write disturb", unwanted reverse tunneling, or erasing.

It is another object of this invention to provide a method of forming small nitride spacers with well-controlled dimensions and well-defined shapes through a judicious use of a fully wet etch technique, including main-etch and over-etch.

It is still another object of the present invention to provide a method where the process window is big enough to easily control the dimension and shape of the very small silicon nitride spacers that are useful in split gate flash memory cells.

It is yet another object of the present invention to provide a method of forming tiny silicon nitride spacers with an improved product cycle time by combining the etching of the tiny spacers with the step of removing the photomask after the performing of the voltage threshold implant.

These objects are accomplished by providing a substrate having a plurality of active and field regions defined; forming a gate oxide layer over said substrate; forming a first polysilicon layer over said gate oxide layer; forming a nitride hard mask layer over said first polysilicon layer; etching the nitride hard mask layer to define a floating gate area; forming a poly oxide layer over said floating gate structure; etching said first polysilicon layer to define a floating gate structure; forming a tunnel oxide layer over said substrate, including over said polyoxide layer; forming a silicon nitride layer over said tunnel oxide layer; performing a wet main-etch of said silicon nitride (SiN) layer to form first SiN spacers along the vertical sidewalls of said floating gate structure; performing a wet over-etch of said first SiN spacers to form tiny second SiN spacers along the vertical sidewalls of said floating gate structure; forming a voltage threshold (VT)-implant photomask over said substrate; performing a VT-implant; removing said VT-implant photomask; forming a low voltage threshold (VTE)-implant photomask; performing a VTE-implant; implant; removing said VTE-implant photomask; forming an intergate oxide layer over said floating gate; forming a second polysilicon layer over said poly oxide layer; and etching said second polysilicon layer to form a control gate over said intergate poly oxide layer.

These objects are accomplished in a first embodiment where the main-etch and over-etch are accomplished using a recipe comprising a hot phosphoric acid ($H_3PO_4$) solution. In the second embodiment, phosphoric solution is used for main-etch only, while a Caro's-Sulfuric Peroxide solution ($H_2SO_4+H_2O_2$), or CR-SPM, is used as an over-etch in forming the tiny silicon nitride spacers of the invention. In the third embodiment, the step of over-etching of the spacers is combined with the step of stripping off of an implant photomask, thus, shortening the manufacturing product cycle.

BRIEF DESCRIPTION OF THE DRAWINGS

FIG. 1 is a cross-sectional view of a portion of a semiconductor substrate showing a split-gate flash memory cell of prior art.

FIG. 2a is a cross-sectional view of a portion of a semiconductor substrate showing the patterning of a first photoresist layer formed over a layer of nitride overlying first polysilicon layer, which in turn is formed over the gate oxide layer, according to this invention.

FIG. 2b is a cross-sectional view of a portion of a semiconductor substrate showing the forming of an opening in the nitride layer of FIG. 2a and exposing portion of the first polysilicon layer, according to this invention.

FIG. 2c is a cross-sectional view of a portion of a semiconductor substrate showing the forming of polyoxide over the exposed portion of the first polysilicon layer of FIG. 2b, according to this invention.

FIG. 2d is a cross-sectional view of a portion of a semiconductor substrate showing the forming of the floating gate of this invention.

DESCRIPTION OF THE PREFERRED EMBODIMENTS

Figure 2E:
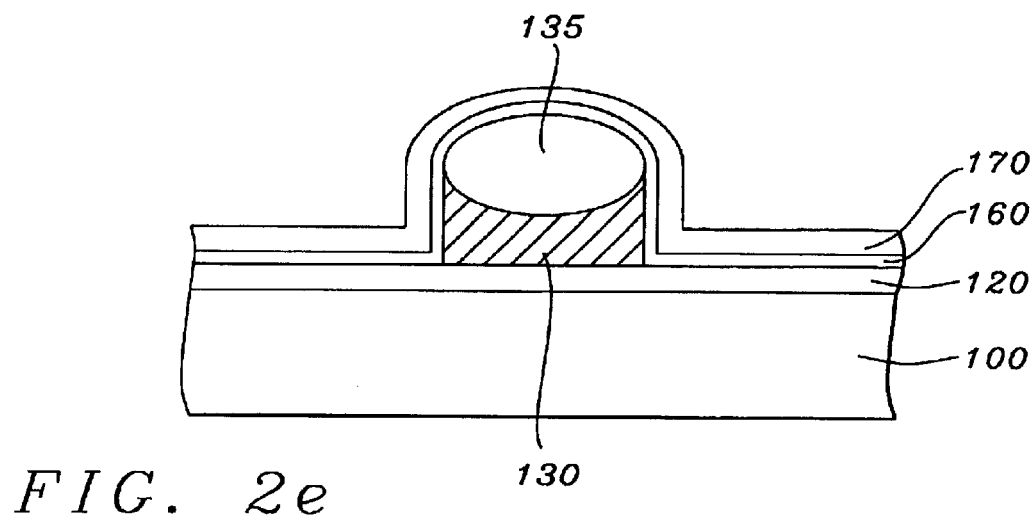
FIG. 2e is a cross-sectional view of a portion of a semiconductor substrate showing the forming of a tunnel oxide layer followed silicon nitride layer on the floating gate of this invention.

Referring now to the drawings, in particular to FIGS. 2a–2i, there is shown cross-sectional views of a substrate as the steps of the instant invention are practiced. The process steps are further summarized in Process Flow Charts in FIGS. 3a–3c. It will be appreciated by those skilled in the art that the fully isotropic wet etch method that is disclosed here is different from the conventional method of using only anisotropic dry etch method, and also different from a combination of dry anisotropic and wet isotropic methods practiced in the present manufacturing line. In contrast to the conventional only anisotropic dry etch methods, the isotropic fully wet etch method widens the conventional dry etch only process window (that is, process etch time) up to one hundred times or more so that the etching of very small dimensions can be controlled much more precisely. It is shown below in the embodiments of the present invention that a particular wet etch recipe must also be used in order to attain the wider process windows. The resulting well defined and well shaped silicon nitride spacers enhance the endurance of the split-gate flash memory cell, as well as preventing the occurrence of "write disturb" phenomenon, or the unwanted reverse tunneling and erasing that is well known in the art.

In FIG. 2a, gate oxide layer (120) is formed over substrate (100), preferably silicon. Gate oxide (120) can be formed by thermal oxidation process at a temperature between about 700 to 1000° C. Alternatively, the gate oxide can be formed by an atmospheric or low-pressure chemical vapor deposition (LPCVD) process as is well known. Gate oxide material can typically be $SiO_2$, but may also be high-k (dielectric constant) materials such as $TiO_2$, $Ta_2O_5$, $HfO_2$, etc. Gate oxide layer (120) has an equivalent oxide thickness between about 30 to 120 angstroms (Å).

Next, first polysilicon layer (130) is formed over the gate oxide layer through reduction of $SiH_4$ using LPCVD at a temperature between about 500 to 750° C. The preferred thickness of the first layer of polysilicon is between about 1200 to 2000 Å. This is followed by forming nitride layer (140) shown in FIG. 2a by reacting dichlorosilane ($SiCl_2H_2$) with ammonia ($NH_3$) in an LPCVD at a temperature between about 600 to 800° C. The preferred thickness of the nitride layer is between about 1300 to 1700 Å. A photoresist mask (150) having patterns (155) is next formed over the nitride layer corresponding to areas where floating gates are to be defined also as shown in FIG. 2a. The patterns are then etched into nitride layer (140) forming openings (145) where portion of the underlying first polysilicon layer (130) is exposed as shown in FIG. 2b. It is preferred that the etching of nitride layer (140) is accomplished with a recipe comprising gases $CF_4$ and $CHF_3$. Afterwards, the photoresist layer is removed by oxygen plasma ashing.

Next, first polysilicon layer (130) that is exposed in the pattern openings (145) in the nitride layer is oxidized to form polyoxide (135) as shown in FIG. 2c. Subsequently, the nitride layer is removed where now polyoxide (135) serves as a hard mask to remove all the first polysilicon portions except those that are covered by the overlying polyoxide layer as shown in FIG. 2d. It is important that the sidewall of the floating gate so formed has vertical wall and that the etching of the polysilicon is accomplished with a recipe comprising $Cl_2$ and HBr.

Then, tunnel oxide layer (160) is formed over the substrate, including the vertical sidewall of floating gate (130) as shown in FIG. 2e. The tunnel oxide is formed by thermal oxidation to an equivalent oxide thickness between about 50 to 200 Å. This is followed by forming silicon nitride $Si_3N_4$, or SiN in short, layer (170) over the tunnel oxide layer. $Si_3N_4$ is formed by reacting dichlorosilane $SiH_2Cl_2$ with ammonia $NH_3$ in an LPCVD at a temperature between about 600 to 800°. It is preferred that the thickness of the silicon nitride layer is between about 180 to 250 Å.

Figure 2F:
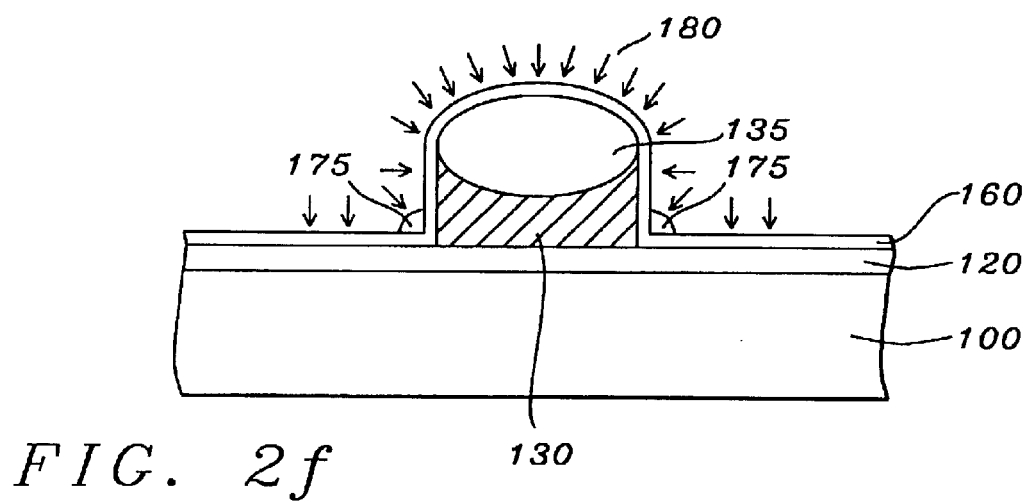
FIG. 2f is a cross-sectional view of a portion of a semiconductor substrate showing the forming of silicon nitride spacers using dry etch, according to the present invention.

Next, and as a main feature and key aspect of the present invention, SiN layer (170) is subjected to isotropic full wet etch (180) until a timed point is reached, as shown in FIG. 2f. It is important that the wet etch recipe comprises hot phosphoric acid ($H_3PO_4$) solution. It is to be noted that, normally, anisotropic dry etch is employed in forming SiN spacers (173). However, it has been the experience of the present manufacturing line that it is very difficult to form sustainable nitride spacers with the dry etch technique that is used. The resulting spacers are usually of erratic shapes and fragile as seen in reference to numeral (175) in FIG. 2g. This is primarily because the process window of dry etching time is very short, namely, about three seconds, during which time it is very difficult to control the dimensional integrity of the spacers, especially if tiny spacers are desired. Because of the fragility of the spacer formed on the vertical walls of the floating gate, the spacer as well as the adjacent interpoly oxide become degraded. Thus, the well-known programming "write disturb" occurs due to the unsatisfactory barrier to reverse tunneling provided by the ineffective silicon nitride spacers (175). Furthermore, the degraded oxide and nitride spacer contribute to the unacceptably low endurance levels as well.

It will be apparent to those skilled in the art that any means for widening the process window in forming very small spacers would be much welcomed. Hence, as a preferred embodiment of the present invention, the first SiN spacers shown in FIG. 2f are further subjected to wet over-etch, instead of the conventional dry over-etch, in the same hot phosphoric acid ($H_3PO_4$) solution. In other words, the first SiN spacers shown in FIG. 2f need to be further diminished in size in order to be even more effective in the performance of the cell, and the same etch is continued to form the tiny second SiN spacers (177), as shown in FIG. 2h.

Figure 2G:
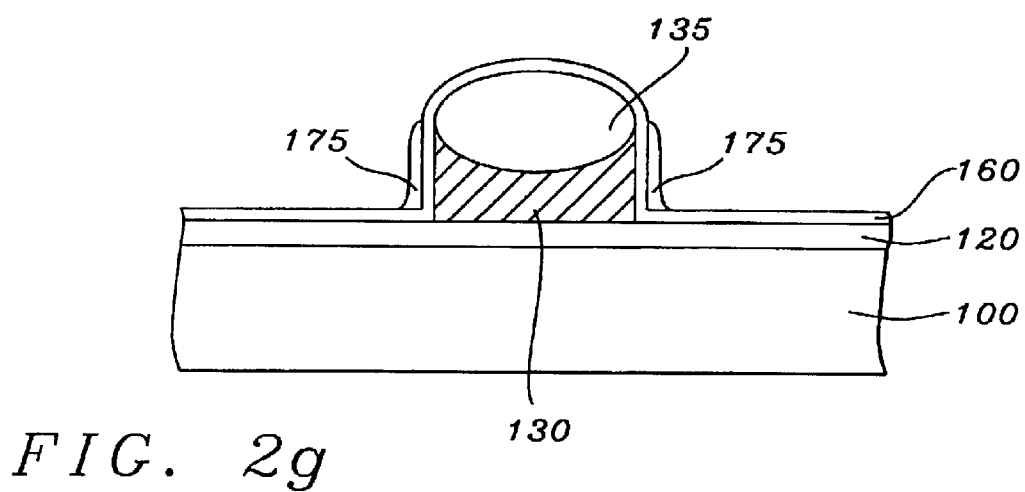
FIG. 2g is a cross-sectional view of a portion of a semiconductor substrate showing the forming of small silicon nitride spacers using dry over-etch, as currently practiced in the manufacturing line.
Figure 2H:
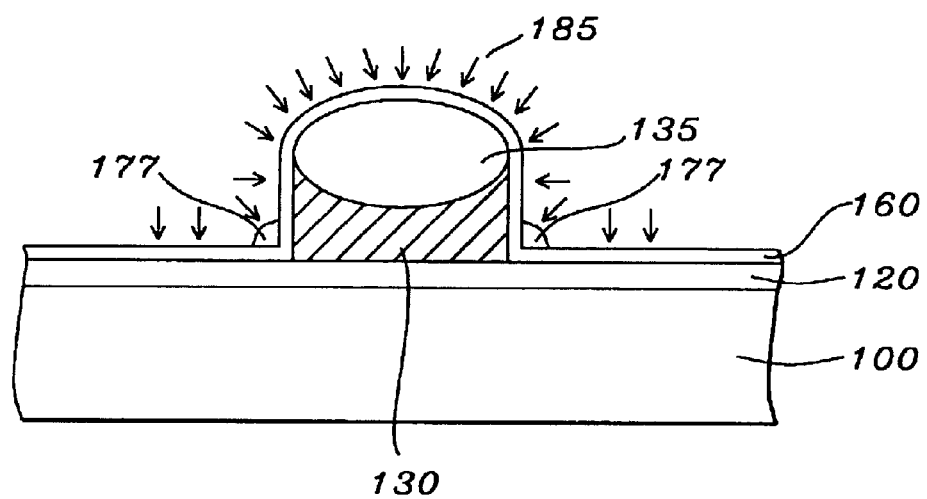
FIG. 2h is a cross-sectional view of a portion of a semiconductor substrate showing the forming of tiny silicon nitride spacers of this invention using wet over-etch, according to the present invention.

It has been found that, the process window for forming tiny second silicon nitride spacers (177) of FIG. 2h with the disclosed fully wet etch method—namely wet main-etch as well as wet over-etch—has been more than tripled to ten seconds—in comparison with the three seconds of the conventional dry etch only method—in the case with hot phosphoric acid solution.

After the forming of the tiny second SiN spacers (177) of the instant invention, threshold voltage (VT) adjustment is performed by first forming a VT-implant photomask (not shown), and then implanting $BF_2^+$ ions at a dosage level between about $2 \times 10^{11}$ to $5 \times 10^{11}$ atoms/cm² at energy level between about 50 to 90 KEV. Then the photomask is removed by stripping it in a Caro's-Sulfuric Peroxide solution ($H_2SO_4 + H_2O_2$), referred to as CR-SPM.

It has also been found that if the wet over-etch, after the main-etch, is performed with the same CR-SPM solution, the process window for etching can be increased hundred-fold to eight minutes in comparison to the dry etch time. This is because the etch rate for the Caro's CR-SPM ($H_2SO_4 + H_2O_2$) solution is 0.5 Å/minute, while for the ($H_3PO_4$) solution it is 60 Å/minute. The improved process window will be employed in a second embodiment disclosed below. The wet over-etch is referred to in FIG. 2h with numeral (185), and a comparison of the process windows is given in the table below:

TABLE I

| Condition | Method | Proc. Wind. | Improv. |
|---|---|---|---|
| Fully dry | Dry End-Point (E/P) + Over-Etch (OE) | 3 seconds | 1× |
| Fully wet (1) | $H_3PO_4$ Main Etch (ME) + $H_3PO_4$ OE | 10 seconds | >3× |
| Fully wet (2) | $H_3PO_4$ ME + ($H_2SO_4 + H_2O_2$) OE | 8 minutes | >100× |

Thus, it will be apparent that with the much-improved process windows of the disclosed fully wet etch method, the dimensions of the tiny spacers can be much better controlled. Also, because of the doubly isotropic nature of the full wet etch, the shape of the tiny spacers is more uniform than erratic as would be the case with other faster etch recipes (FIG. 2g).

Figure 3A:
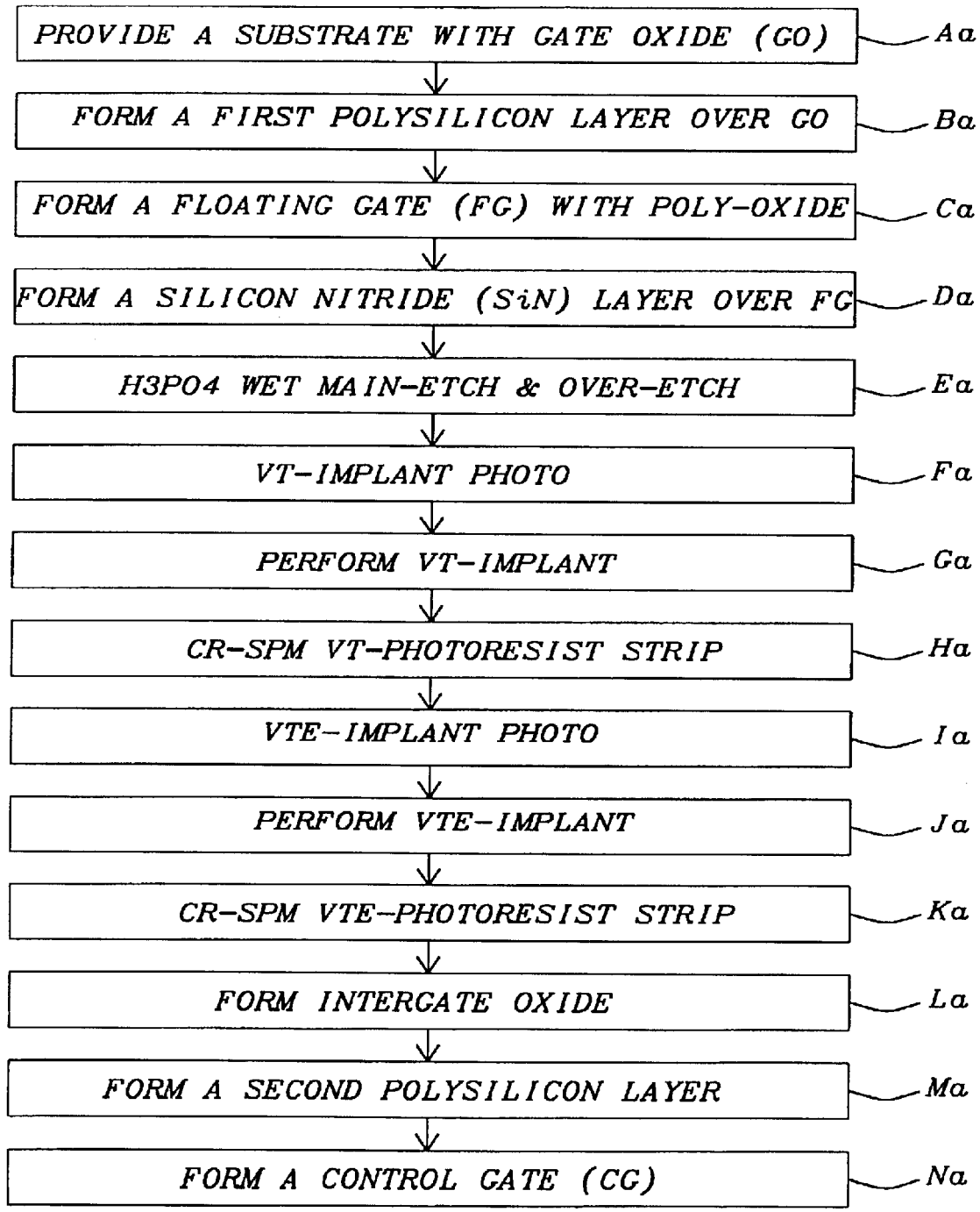
FIG. 3a is a Flow Chart showing the steps of forming tiny silicon nitride spacers for a split gate flash EPROM cell in a first embodiment where main-etch and over-etch are accomplished using a recipe comprising a hot phosphoric acid ($H_3PO_4$) solution, according to the present invention.

The above process steps are also summarized in the flow chart shown in FIG. 3a, beginning with step (Aa) and ending with step (Na). It will be noted in the capitalized key step (Ea) of the instant invention that the same ($H_3PO_4$) solution is used for both the main-etch and over-etch of the silicon nitride spacers. However, as stated earlier, and shown in Table I above, it has been determined that if CR-SPM solution is used as a wet over-etch, the process window is improved by a factor of 100× with respect to the conventional dry etch, and 10× with respect to the phosphoric solution of the first embodiment. Thus, a second embodiment is disclosed in FIG. 3b for forming tiny SiN spacers, where while the wet main-etch is performed with phosphoric solution ($H_3PO_4$), the over-etch is continued with the Caro'sCR-SPM ($H_2SO_4+H_2O_2$) solution.

Figure 3B:
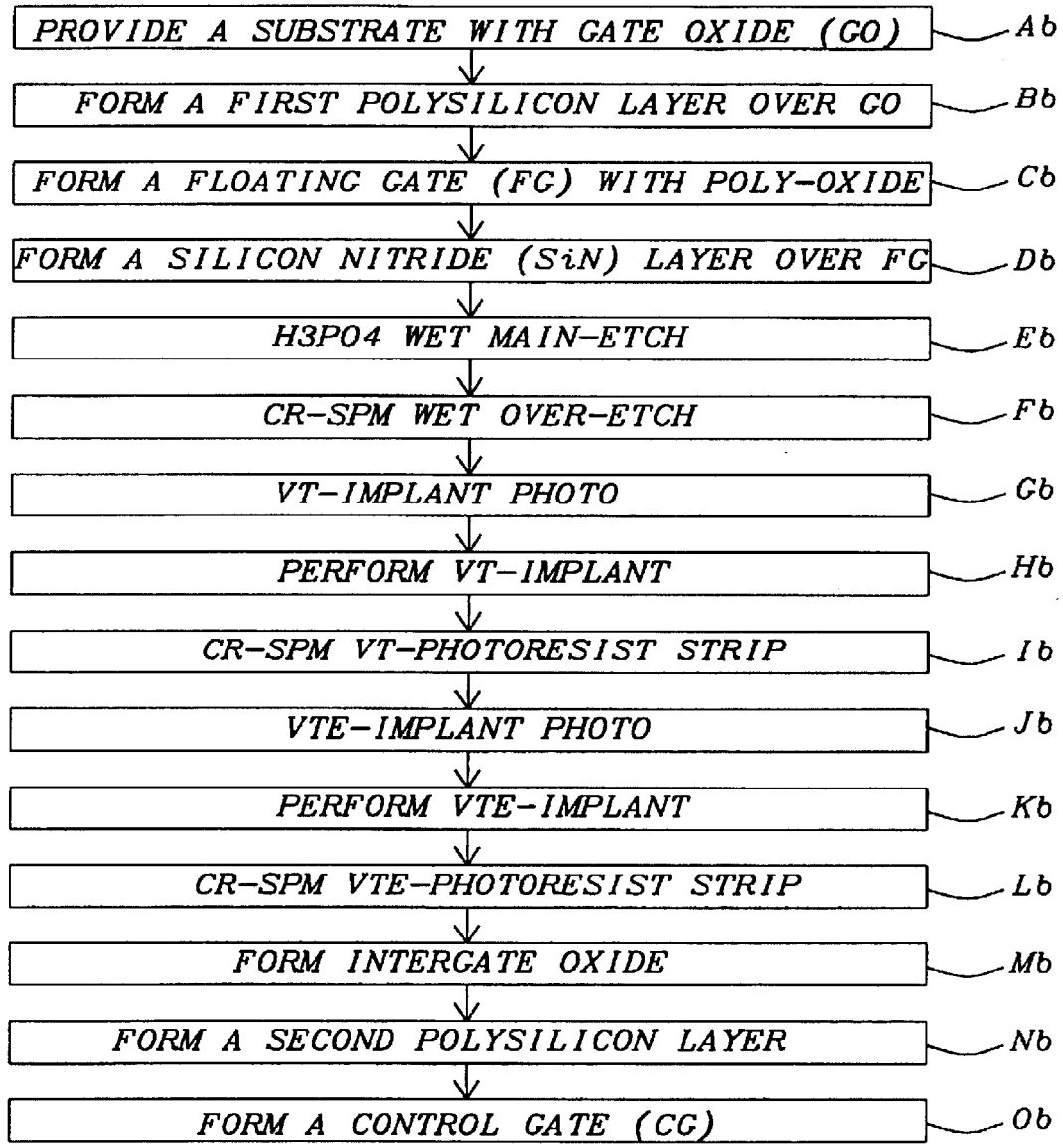
FIG. 3b is a Flow Chart showing the steps of forming tiny silicon nitride spacers for a split gate flash EPROM cell in a second embodiment where phosphoric solution is used for main-etch only, while a Caro's-Sulfuric Peroxide solution ($H_2SO_4+H_2O_2$), or CR-SPM, is used as an over-etch in forming the tiny silicon nitride spacers of the invention.

Further, it will be noted that the CR-SPM solution used for wet over-etch in FIG. 3b of the second embodiment is also used for stripping off of the VT-implant photomask of the first embodiment. Hence, the two process steps can be combined to improve the product cycle time. This is shown as a third embodiment in FIG. 3c.

Figure 3C:
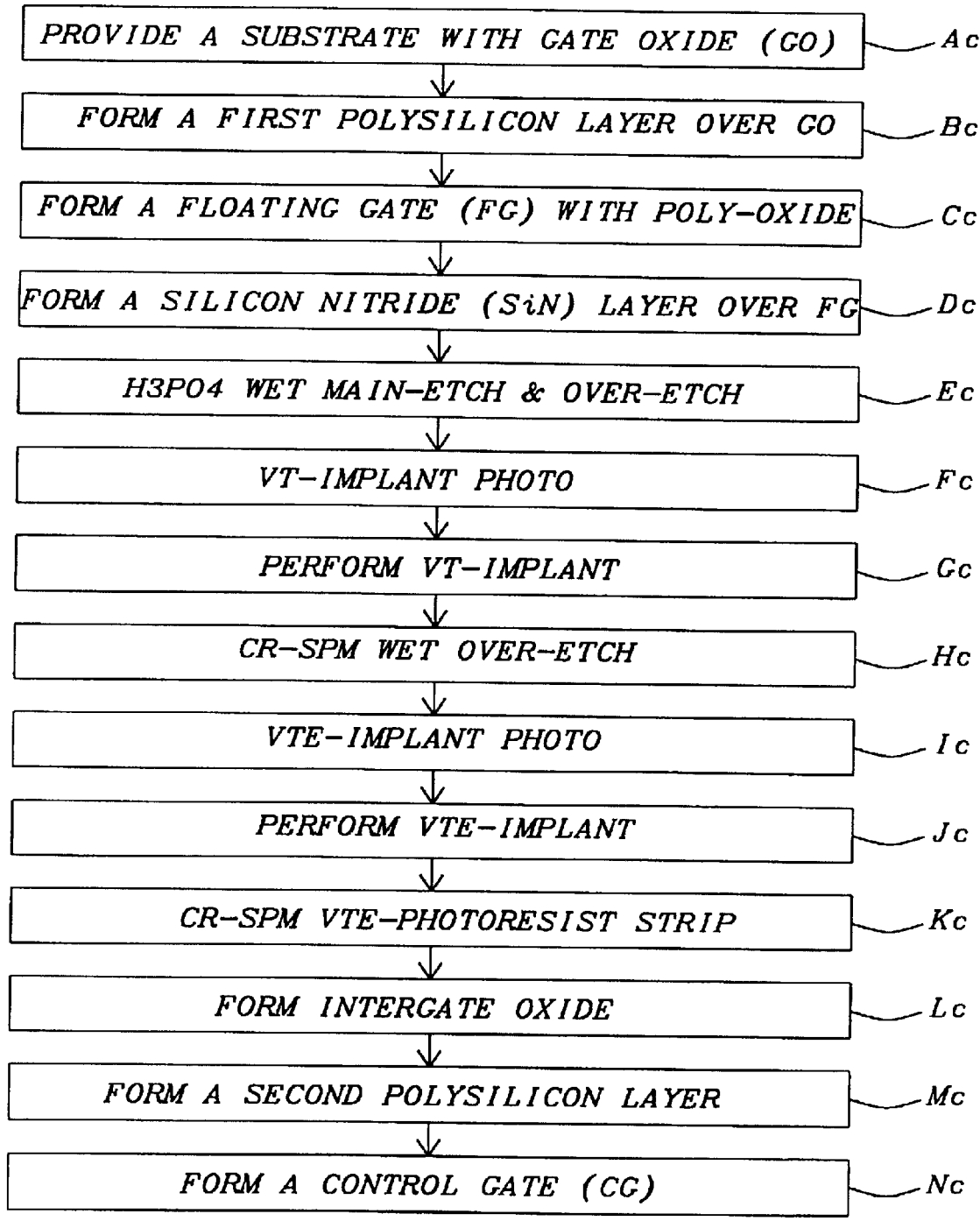
FIG. 3c is a Flow Chart showing the steps of forming tiny silicon nitride spacers for a split gate flash EPROM cell in a third embodiment where the step of over-etching of the nitride spacers is combined with the step of stripping off of an implant photomask, thus, shortening the manufacturing product cycle, according to the present invention.

Therefore, as another key aspect of the present invention, a third embodiment is disclosed in FIG. 3c where steps (Ac) through (Dc) are the same as those corresponding steps (Ab)–(Db) of the second, as well as steps (Aa)–(Da) of the first embodiment, but in the third embodiment, the wet over-etch of the tiny silicon nitride spacers is postponed until after the completion of the VT-implant. The forming of the VT-implant photomask and the subsequent VT-implantation steps of the three embodiments, namely, steps (Fa) and (Ga) in FIG. 3a, steps (Gb) and (Hb) in FIG. 3b, and steps (Fc) and (Gc) in FIG. 3c, respectively, are all the same. Also the stripping off of the TV-implant photomask is the same for all three embodiments with the CR-SPM solution comprising ($H_2SO_4+H_2O_2$), namely, sulfuric acid and hydrogen peroxide wet-etch. However, in the third embodiment, the tiny silicon nitride spacers of the invention, (177) shown in FIG. 2h, are formed at the same time the VT-implant photomask is stripped; step (Hc) in FIG. 3c. It will be appreciated by those skilled in the art that with the 100× improvement in the process window as shown in Table I above, the preferred tiny dimensions of SiN spacers (177) between about 200 to 250 Å, both in height as well as in width, can be controlled quite well with well-defined shape.

The remaining steps, namely steps (Ia–Na) of the first embodiment, steps (Jb–Ob) of the second embodiment, and steps (Ic–Nc) of the third embodiment for completing the forming of the split-gate flash EPROM of the invention are the same. In steps (Ja), (Jb) and (Jc) of the first, second and third embodiments, respectively, a low threshold voltage (VTE) adjustment is performed through ion implantation. First, a VTE-implant photomask is formed by spin coating the substrate with a photoresist. Then VTE-implant is performed using ions $BF_2^+$ at a dosage level between about $1\times10^{12}$ to $3\times10^{12}$ atoms/cm$^2$ and energy between about 50 to 90 KEV. Subsequently, the VTE-implant photomask is stripped using the CR-SPM solution as before.

Figure 2I:
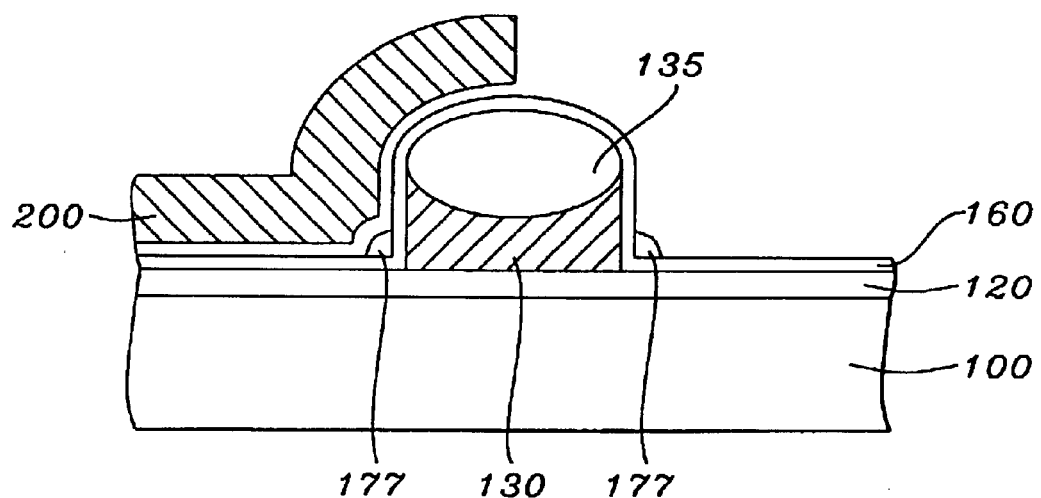
FIG. 2i is a cross-sectional view of a portion of a semiconductor substrate showing the completion of the split-gate flash memory cell of this invention where well-defined, tiny $Si_3N_4$ spacers are formed according to this invention.

As a penultimate step, intergate oxide layer (190) is formed over the substrate, including over the floating gate structure of FIG. 2i, followed by the forming of control gate (200). It is preferred that the intergate oxide layer is performed by thermal oxidation process to a thickness between about 80 to 150 Å. And the control gate is etched from a second polysilicon layer having a thickness between about 1200 to 2000 Å and formed from source $SiH_4$ in an LPCVD chamber at a temperature between about 500 to 750° C. It will be noted that the both the first and third embodiments have one less step than the second embodiment, and hence they are useful for reducing product cycle time.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as the sequence of performing the CR-SPM over-etch in forming nitride spacers.

That is, while the invention has been particularly shown and described with reference to the preferred embodiments thereof, it will be understood by those skilled in the art that various changes in form and details may be made without departing from the spirit and scope of the invention.

What is claimed is:

1. A method, comprising the steps of:
   providing a semiconductor structure;
   forming a first oxide layer over said semiconductor structure;
   forming a first polysilicon layer over said first oxide layer;
   etching said first polysilicon layer to define a gate structure, said gate structure having sidewalls;
   forming a second oxide layer over said first polysilicon layer;
   forming a third oxide layer over said semiconductor structure, including over said second oxide layer;
   forming a silicon nitride (SiN) layer over said third oxide layer;
   performing a fist wet etch of said SiN layer to form first SiN spacers along the sidewalls of said gate structure, said spacers having a height;
   performing a second wet etch of said first SiN spacers to form second SiN spacers along the sidewalls, said second spacers having a height less than the height of the first SiN spacers.

2. The method of claim 1, wherein said first oxide layer has a thickness between about 30 to 120 Å.

3. The method of claim 1, wherein said first polysilicon layer has a thickness between about 1200 to 2000 Å.

4. The method of claim 1, wherein said etching said first polysilicon layer to define the gate structure is performed using an etching solution comprising $Cl_2$ and HBr with poly oxide hard mask.

5. The method of claim 1, wherein said second oxide layer has a thickness between about 1500 to 2000 Å.

6. The method of claim 1, wherein said third oxide layer has a thickness between about 100 to 200 Å.

7. The method of claim 1, wherein said forming said SiN layer is accomplished with LPCVD by reacting dichlorosilane ($SiCl_2H_2$) with ammonia ($NH_3$).

8. The method of claim 1, wherein said SiN layer has a thickness between about 180 to 250 Å.

9. The method of claim 1, wherein said performing said first wet etch to form said first SiN spacers is performed using an etching solution comprising a phosphoric acid ($H_3PO_4$).

10. The method of claim 1, wherein said performing said second wet etch to form said second SiN spacers is performed using an etching solution comprising phosphoric acid ($H_3PO_4$).

11. The method according to claim 1, further comprising the steps of:
   performing a threshold voltage adjustment of the gate structure; and
   performing a low-threshold voltage adjustment of the gate structure.

12. The method of claim 11, wherein said performing said threshold voltage adjustment of the gate structure is accomplished by applying a first photomask layer over at least a portion of the gate structure and implanting $BF_2^+$ ions in at least a portion of the gate structure at a dosage level between about $2 \times 10^{11}$ to $5 \times 10^{11}$ atoms/cm$^2$ and energy between about 50 to 90 KEV.

13. The method of claim 11, wherein said performing said low threshold voltage adjustment of the gate structure is accomplished by applying a second photomask layer over at least a portion of the gate structure and implanting $BF_2^+$ ions in at least a portion of the gate structure at a dosage level between about $1 \times 10^{12}$ to $3 \times 10^{12}$ atoms/cm$^2$ and energy between about 50 to 90 KEV.

14. The method of claim 1, further comprising forming a fourth oxide layer over at least said second SiN spacers wherein said fourth oxide layer has a thickness between about 80 to 150 Å.

15. The method of claim 1, further comprising forming a second polysilicon layer over said second oxide layer, wherein said second polysilicon layer has a thickness between about 1200 to 2000 Å.

16. The method of claim 15, further comprising etching said second polysilicon layer to form a control gate over said fourth oxide layer, wherein said etching said second polysilicon layer is accomplished using a solution comprising $Cl_2$ and HBr.

17. A method, comprising the steps of:
providing a substrate having a gate structure and a first oxide layer formed thereon, said gate structure having sidewalls;
forming a second oxide layer over said substrate and said first oxide layer;
forming a silicon nitride (SiN) layer over said substrate and said first oxide layer;
performing a first wet etch of said SiN layer to form first SiN spacers along the sidewalls of said gate structure, said spacers having a height;
performing a second wet etch of said first SiN spacers to form second SiN spacers, said second SiN spacers having a height less than the height of the first SiN spacers.

18. The method of claim 17, wherein said second oxide is formed by a thermal oxidation process.

19. The method of claim 17, wherein said second oxide has a thickness between about 50 to 200 Å.

20. The method of claim 17, wherein forming said SiN layer is accomplished with LPCVD by reacting dichlorosilane ($SiCl_2H_2$) with ammonia ($NH_3$).

21. The method of claim 17, wherein said SiN layer has a thickness between about 180 to 250 Å.

22. The method of claim 17, wherein said performing said first wet etch to form said first SiN spacers is performed using an etching solution comprising phosphoric acid ($H_3PO_4$).

23. The method according to claim 17, further comprising the steps of:
performing a threshold voltage adjustment of the gate structure; and
performing a low-threshold voltage adjustment of the gate structure.

24. The method of claim 23, wherein said performing said threshold voltage adjustment of the gate structure is accomplished by applying a first photomask layer over at least a portion of the gate structure and implanting $BF_2^+$ ions in at least a portion of the gate structure at a dosage level between about $2 \times 10^{11}$ to $5 \times 10^{11}$ atoms/cm$^2$ and energy between about 50 to 90 KEV.

25. The method of claim 23, wherein said performing said low threshold voltage adjustment of the gate structure is accomplished by applying a second photomask layer over at least a portion of the gate structure and implanting $BF_2^+$ ions in at least a portion of the gate structure a dosage level between about $1 \times 10^{12}$ to $3 \times 10^{12}$ atoms/cm$^2$ and energy between about 50 to 90 KEV.

26. The method of claim 17, further comprising forming a third oxide layer over at least said second SiN spacers, wherein said third oxide layer has a thickness between about 80 to 150 Å.

27. The method of claim 17, further comprising forming a polysilicon layer over said first oxide layer, wherein said polysilicon layer has a thickness between about 1200 to 2000 Å.

28. The method of claim 27, further comprising etching said polysilicon layer to form a control gate over said third oxide layer, wherein said etching said polysilicon layer is accomplished using a solution comprising $Cl_2$ and HBr.

* * * * *

UNITED STATES PATENT AND TRADEMARK OFFICE
CERTIFICATE OF CORRECTION

PATENT NO. : 6,908,813 B2
DATED : June 21, 2005
INVENTOR(S) : Liu et al.

It is certified that error appears in the above-identified patent and that said Letters Patent is hereby corrected as shown below:

Column 8,
Line 31, please delete "fist" and insert -- first --.

Signed and Sealed this

Eighth Day of November, 2005

JON W. DUDAS
*Director of the United States Patent and Trademark Office*